United States Patent [19]
Jones, Jr.

[11] Patent Number: 5,405,796
[45] Date of Patent: Apr. 11, 1995

[54] CAPACITOR AND METHOD OF FORMATION AND A MEMORY CELL FORMED THEREFROM

[75] Inventor: Robert E. Jones, Jr., Austin, Tex.

[73] Assignee: Motorola, Inc., Schaumburg, Ill.

[21] Appl. No.: 182,470

[22] Filed: Jan. 18, 1994

Related U.S. Application Data

[62] Division of Ser. No. 887,942, May 26, 1992, Pat. No. 5,313,089.

[51] Int. Cl.⁶ .................................... H01L 27/108
[52] U.S. Cl. ...................... 437/47; 437/52; 437/60; 437/919
[58] Field of Search ............ 437/47, 48, 52, 60, 437/238, 919

[56] References Cited

U.S. PATENT DOCUMENTS

| | | | |
|---|---|---|---|
| 4,987,470 | 1/1991 | Suzuki et al. | 357/49 |
| 5,045,899 | 5/1990 | Arimoto | 357/23.6 |
| 5,046,043 | 9/1991 | Miller et al. | 365/145 |
| 5,047,815 | 9/1991 | Yasuhira et al. | 357/23.6 |
| 5,106,775 | 4/1992 | Kaga et al. | 437/919 |
| 5,150,276 | 9/1992 | Gonzalez et al. | 361/313 |
| 5,155,573 | 10/1992 | Abe et al. | 357/51 |
| 5,185,282 | 2/1993 | Lee et al. | 437/52 |

FOREIGN PATENT DOCUMENTS

| | | |
|---|---|---|
| 60-158654 | 8/1985 | Japan. |
| 63-94669 | 4/1988 | Japan. |
| 3-11761 | 1/1991 | Japan. |
| 3231458 | 10/1991 | Japan. |

*Primary Examiner*—Tom Thomas
*Attorney, Agent, or Firm*—Lee E. Chastain

[57] ABSTRACT

A capacitor for use in a memory cell (10). A transistor is formed overlying a substrate (10). The transistor has a first current electrode (16) and a second current electrode (18). The current electrodes (16 and 18) are separated by a channel region. A gate electrode (26) is formed overlying the channel region and is physically separated from the channel region by a gate dielectric layer (24). A plug region (32) is formed overlying and electrically connected to the first current electrode (16). An annular high-permittivity dielectric region (33) is formed overlying the transistor and is formed from a high-permittivity dielectric layer (36). A first capacitor electrode is formed via a conductive region (38″), and a second capacitor electrode is formed via a conductive region (38′). The memory cell (10) can be formed as a non-volatile memory cell or a DRAM cell depending upon various properties of the annular high-permittivity dielectric region (33).

22 Claims, 6 Drawing Sheets

CAPACITOR AND METHOD OF FORMATION AND A MEMORY CELL FORMED THEREFROM

This is a divisional of application Ser. No. 07/887,942, filed May 26, 1992, U.S. Pat. No. 5,313,089.

FIELD OF THE INVENTION

The present invention relates generally to semiconductor technology, and more particularly, to capacitor structures used in semiconductors, such as memories.

BACKGROUND OF THE INVENTION

For decades, capacitors have been an important and irreplaceable circuit element used often in electronic circuit designs. For example, capacitors are widely used in applications such as dynamic random access memory (DRAM), active and passive filters, analog-to-digital and digital-to-analog converters (A/D and D/A converters, respectively), operational amplifiers, radio and tuning circuits, oscillators and multivibrator circuits, time critical and time delay circuitry, noise reduction circuitry, charge pumps, power electronics, and many other diverse applications. A capacitor is defined in the simplest terms as a device having two conducting surfaces separated by an insulating material. A capacitor stores electrical charge, blocks the flow of direct current (DC), and permits the flow of alternating current (AC) depending essentially upon the capacitance of the device and the frequency of the incoming current or charge. Capacitance, measured in farads, is determined by three physical characteristics: (1) a thickness or average thickness of the insulating material separating the two conducting surfaces; (2) how much surface area is covered by the two conducting surfaces; and (3) various mechanical and electrical properties of the insulating material and the two conducting surfaces or electrodes.

Many forms of capacitors exist in the semiconductor industry. In the early development and marketing of the above mentioned technologies, parallel plate or parallel electrode capacitors were used as capacitance structures. The parallel electrode capacitor is a capacitor that has a planar top and a planar bottom conducting surface separated by a planar dielectric or insulator. The planar capacitor, although easy to manufacture, consumes a large amount of substrate surface area. Capacitors which have a large substrate surface area are not practical for use with current memory technology. Current memory technology requires capacitors which have small substrate surface areas in order to achieve competitive integrated circuit densities.

Another widely accepted capacitor structure is known as a trench capacitor. The trench capacitor is formed by first etching a deep well, trench, or hole in a substrate surface or a surface overlying the substrate surface. This trench or hole is used to form and contain two electrodes separated by an insulator, which is referred to as an inter-electrode dielectric. Other known structures such as double box capacitors, crown capacitors, fin capacitors, and other similar capacitive structures have been developed for memory cells.

In most cases, the capacitive structures discussed above are not easy to manufacture when the inter-electrode dielectric of the capacitive structure is made of an advanced material, such as a ferroelectric material or a high-permittivity dielectric. Capacitor electrodes that are made of advanced materials, such as conductive oxides and refractory metals, are also difficult to manufacture with the capacitive structures discussed above. In addition, all the capacitor structures mentioned above have a first electrode that is formed before the inter-electrode dielectric is formed. Therefore, the first electrode is exposed to heat cycles and various ambient conditions, such as an oxidizing ambient, which may damage or alter the performance of the overall capacitor structure.

As memory technology advanced, new materials, such as lead zirconium titanate and other ferroelectric materials were used to transform a dynamic random access memory (DRAM) cell into a non-volatile memory. In most cases where ferroelectric materials or high-permittivity dielectric materials are concerned, the capacitor structures described above are too complex or inadequate for use as a non-volatile memory. In many cases, non-volatile memories require inter-electrode dielectrics that are thicker than the inter-electrode dielectric thicknesses typically found in DRAM cells. Therefore, some capacitor structures, such as the trench capacitor and box capacitor, although ideal for DRAM applications, become more difficult to manufacture or increase in substrate surface area for non-volatile memories.

SUMMARY OF THE INVENTION

The previously mentioned disadvantages are overcome and other advantages achieved with the present invention. In one form, the present invention comprises a capacitor and a method of formation thereof. In another form, the capacitor is used to form a memory cell. The capacitor has a substrate. An annular high-permittivity dielectric region is formed overlying the substrate. The annular high-permittivity dielectric region has an inner sidewall and an outer sidewall. The annular high-permittivity dielectric region functions as a capacitor dielectric. A first capacitor electrode is formed adjacent the inner sidewall of the annular high-permittivity dielectric region. A second capacitor electrode is formed adjacent the outer sidewall of the annular high-permittivity dielectric region.

The present invention will be more clearly understood from the detailed description below in conjunction with the accompanying drawings.

DESCRIPTION OF THE PREFERRED EMBODIMENT

Figure 1:
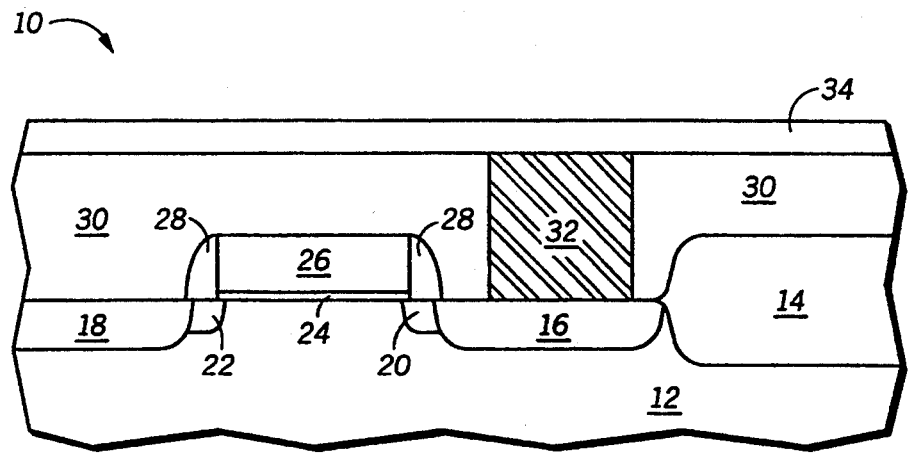
FIGS. 1-5 illustrate, in cross-sectional form, a method for forming a memory cell which has a capacitor in accordance with the present invention.

Illustrated in FIG. 1 is a structure suitable for formation of a memory cell 10 in accordance with the present invention. Memory cell 10 has a substrate 12 which has a top planar surface prior to memory cell processing.

The substrate 12 has a first conductivity type which is one of either a P type conductivity or an N type conductivity if the substrate 12 is silicon-based. Substrate 12 may be made of silicon, gallium arsenide, silicon on sapphire (SOS), epitaxial formations, germanium, germanium silicon, polysilicon, and/or like substrate or conductive materials. Preferably, the substrate 12 is made of silicon.

A field isolation region is formed overlying the substrate via a dielectric layer 14. Dielectric layer 14, which is a field oxide, may be either formed or replaced by other known isolation technologies such as trench isolation, local oxidation of silicon (LOCOS), or polysilicon buffered LOCOS (PBL).

A first current electrode 16 and a second current electrode 18 are formed within the substrate 12. Current electrodes 16 and 18 are usually referred to as a source and a drain respectively. The current electrodes 16 and 18 are diffusion regions of a second conductivity type wherein the second conductivity type is opposite the first conductivity type. A field effect transistor (FET) normally has a source and a drain that are both symmetrical with respect to doping and geometry and are therefore functionally interchangeable. In some cases, current electrodes 16 and 18 are referred to as heavily doped (HDD) regions. Lightly doped drain (LDD) regions 20 and 22 are optionally formed adjacent the current electrodes 16 and 18. The LDD regions 20 and 22 are of the second conductivity type. The formation of LDD regions and the advantages of LDD regions are well known and documented in the prior art. A channel region separates both the current electrode 16 and the LDD region 20 from the current electrode 18 and the LDD region 22.

A gate or gate electrode 26 is formed overlying the channel region. A gate dielectric layer 24 isolates the gate electrode 26 from the channel region. Preferably, the gate dielectric layer 24 is a wet or dry silicon dioxide layer or a like dielectric material. A spacer 28 is formed adjacent the gate electrode 26. Spacer 28 is usually used to form LDD regions and/or HDD regions of a transistor. Therefore, spacer 28 is optional for conventional transistor structures that do not have LDD regions. A complete FET is formed by current electrodes 16 and 18, LDD regions 20 and 22, gate dielectric layer 24, spacer 28, and gate electrode 26.

A dielectric layer 30 is formed overlying the FET and the dielectric layer 14. The dielectric layer 30 as well as other dielectrics described herein may be formed as wet or dry silicon dioxide ($SiO_2$), silicon nitride, tetraethylorthosilicate (TEOS) based oxides, borophospho-silicate-glass (BPSG), phospho-silicate-glass (PSG), boro-silicate-glass (BSG), oxide-nitride-oxide (ONO), plasma enhanced silicon nitride (P-$SiN_x$), a spin on glass (SOG), and/or like dielectric materials unless otherwise noted. Preferably, dielectric layer 30 is one of either a planarized/polished dielectric, a dielectric that has been etched back to form a planar surface, or a spin on glass (SOG). Any one of several chemical and/or mechanical polishing methods which exist in the prior art may be utilized. An opening is lithographically defined in the dielectric layer 30 by known techniques such as lithographical processing, masking, and selective etching. The opening forms an exposed portion of the current electrode 16.

In FIG. 1, a conductive plug region 32 is formed within the opening in the dielectric layer 30. Many methods of plug region formation are known in the prior art. In one form, a plug seed can be formed within the opening. In most cases, a plug seed is either a layer deposited in the opening, a spacer, a selectively formed seed region, or a like region formed within the opening. The plug seed is then used as a starting material to grow the plug region 32. In addition, planarization or etch-back techniques that are mechanical and/or chemical may be used to form the plug region 32. In a preferred form, the plug region 32 is polysilicon, but a metal, a refractory metal, a salicide material, a silicide material, a conductive oxide, an epitaxial silicon region, an amorphous silicon region, or a like conductive material may be used to form the plug region 32. Conductive plug region 32 makes electrical contact to the portion of the current electrode 16 that is exposed by the opening in dielectric layer 30. Various multi-metal layers (tungsten/titanium), glue layers, diffusion barrier layers (TIN), and the like are known and used for conductive plug technology.

In most cases, the plug region 32 is made of a material that is either damaged or oxidized in an oxidizing ambient. Furthermore, high temperatures from subsequent processing may increase the damage or increase adverse chemical reactions in plug region 32. Therefore, an isolation layer or buffer layer 34 is formed overlying the plug region 32. In most cases, the buffer layer 34 is deposited in a conformal manner and therefore also overlies the dielectric layer 30. Buffer layer 34 is a dielectric material or a high-permittivity dielectric material such as titanium oxide ($TiO_2$). The buffer layer 34 may be any material or combination of materials that protects the plug region 32 from adverse subsequent processing or ambient conditions.

In addition, the buffer layer 34 may be used to provide the additional advantage of being a diffusion barrier. To function as a diffusion barrier, buffer layer 34 is formed having a portion that is made of silicon nitride or an equivalent diffusion barrier material. Damage to the plug layer 32 and contamination of overlying layers (not illustrated in FIG. 1) is improved through the use of a diffusion barrier layer.

Figure 2:
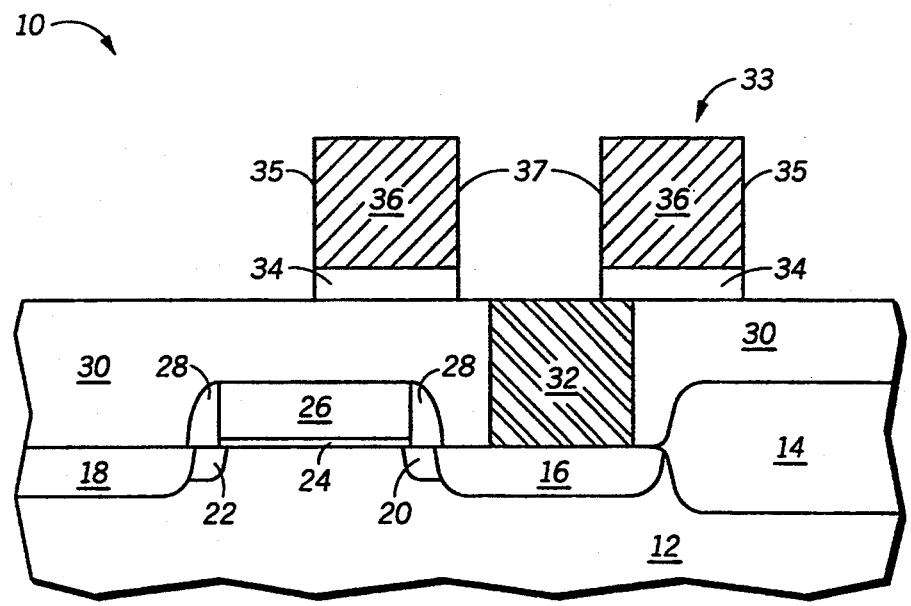

In FIG. 2, a high-permittivity dielectric layer 36 is formed overlying the buffer layer 34. The buffer layer 34, as described herein, is also used to protect the high-permittivity dielectric layer 36. An improper buffer layer 34 may result in unwanted stress, cracking, bubbling, or chemical reaction between the high-permittivity dielectric layer 36 and adjacent regions.

The high-permittivity dielectric layer 36 may be formed from one material or several materials. A high-permittivity dielectric material is used to form the layer 36 when a dynamic random access memory (DRAM) cell is desired. The high-permittivity dielectric layer 36 is formed as a ferroelectric material, which is one specific form of a high-permittivity dielectric, if a non-volatile memory cell is desired. In all cases, the high-permittivity dielectric layer 36 functions as an inter-electrode capacitor dielectric for memory cell 10. Some materials that are used to form the dielectric layer 36 are lead zirconium titanate, barium titanate, lithium niobate, lead lanthanum zirconium titanate, titanium silicate, calcium titanate, bismuth titanate, strontium titanate, lead zirconate, titanium oxide, zirconium oxide, and lead titanate, or like high-permittivity materials. In another form, a plurality of high-permittivity materials may be used to form the high-permittivity dielectric layer 36.

The high-permittivity dielectric layer 36 is masked and etched using conventional techniques to form a cylindrical or annular high-permittivity dielectric region 33 from high-permittivity dielectric layer 36. The buffer layer 34 is subsequently etched and therefore self-aligned under the annular high-permittivity dielectric region 33 formed from layer 36. The annular high-permittivity dielectric region 33 has an inner sidewall 37 and an outer sidewall 35. An opening in the annular high-permittivity dielectric region 33 defined by the inner sidewall 37 exposes a portion of the plug region 32.

Figure 3:
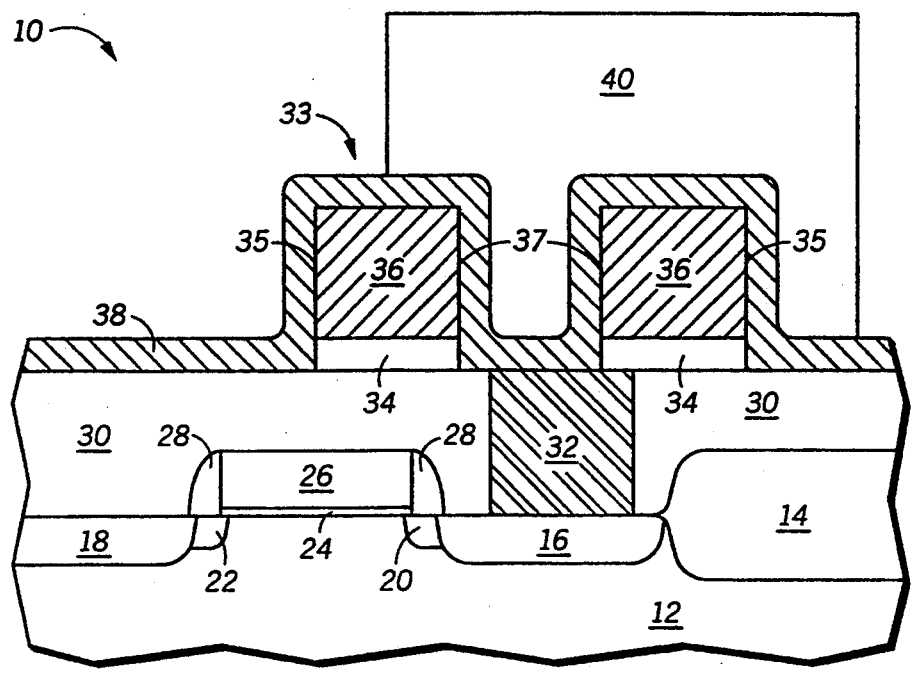

In FIG. 3, a conductive layer 38 is formed overlying the annular high-permittivity dielectric region 33 and the dielectric layer 30. A portion of the conductive layer 38 which lies within the opening in the annular high-permittivity dielectric region 33 forms an electrical connection to the plug region 32. The conductive layer 38 is a material such as platinum, aluminum, ruthenium oxide, copper, tungsten, titanium nitride, titanium, tantalum, molybdenum, ruthenium, gold, tantalum nitride, indium-tin oxide, or a like metallic material or conductor. It is important to note that alloys and combinations of the above listed materials may also be used to form the conductive layer 38.

A masking material 40 is formed overlying the conductive layer 38 in FIG. 3. Preferably, the masking material 40 is a photoresist material but could be a hard mask such as an oxide. The masking material 40 is used to protect portions of conductive layer 38 which are being used for electrical routing.

In some applications, such as DRAM applications, the etch step of conductive layer 38 described above may not be needed. In most cases, DRAMs have one electrode that is required to be at a ground potential. Therefore, all the grounded electrodes in a DRAM may be wired together by forming the conductive layer 38 as a planar un-etched layer of material Through-holes are selectively etched through conductive layer 38 only if electrical connections are required to underlying conductive layers such as gate electrode 26 or current electrode 18.

Figure 4:
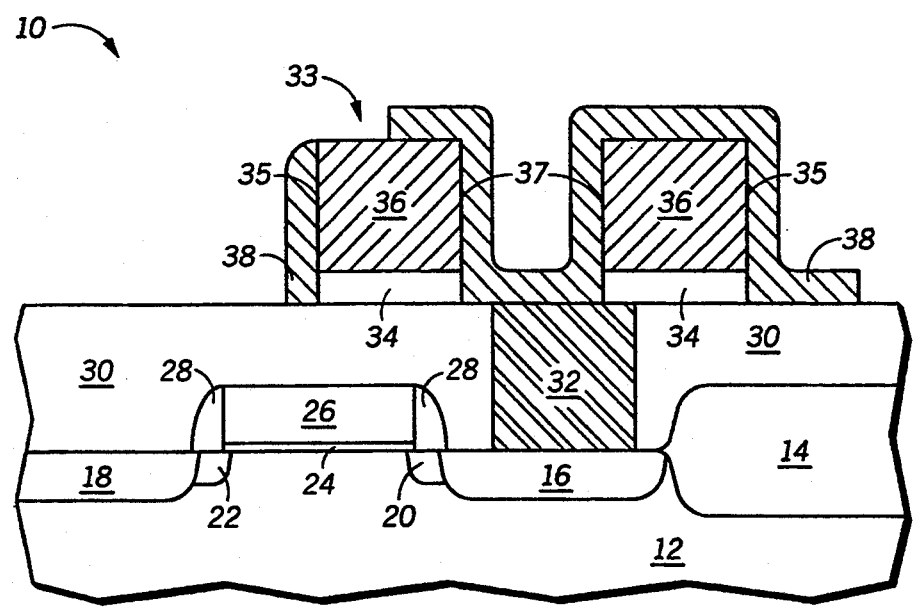

In FIG. 4, the conductive layer 38 is illustrated after the etch step described above in conjunction with FIG. 3. The etch step forms a sidewall spacer portion of conductive region 38 as illustrated.

Figure 5:
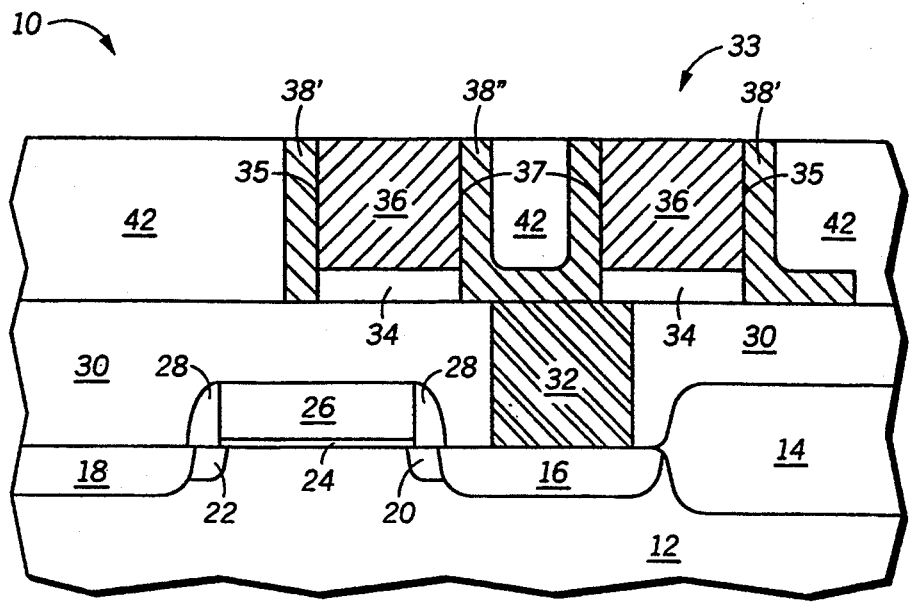

In FIG. 5, an inter-level dielectric referred to as a planar dielectric layer 42 is formed. Dielectric layer 42 is either deposited and etched back or is formed via a spin on glass (SOG) to be planar. An etch-back procedure, which is chemical and/or mechanical, is used to remove a top portion of the dielectric layer 42, to remove a top portion of the conductive layer 38, and to optionally remove a top portion of the annular high-permittivity dielectric region 33 formed by layer 36.

The etch-back procedure described above results in conductive layer 38 being separated into two electrically isolated regions, a conductive region 38' and a conductive region 38". A first capacitor electrode is formed by the conductive region 38". The first capacitor electrode is formed adjacent the inner sidewall 37. Conductive region 38" makes electrical contact to the plug region 32, and therefore electrically contacts the FET current electrode 16. The conductive region 38' forms a second capacitor electrode. The second capacitor electrode is formed adjacent the outer sidewall 35. Therefore, the second capacitor electrode surrounds an outer perimeter of the annular high-permittivity dielectric region 33 which is formed from layer 36.

Conductive region 38' functions slightly different when used in a DRAM cell as opposed to a non-volatile memory cell. If the annular high-permittivity dielectric region 33 is formed as a ferroelectric material and a drive line is used, the memory cell 10 is a non-volatile memory cell. If the annular high-permittivity dielectric region 33 is formed as a high dielectric material and one electrode is grounded, the memory cell 10 is a DRAM cell. If the memory cell 10 is a DRAM cell, the conductive region 38' is connected to ground. If the memory cell 10 is a non-volatile memory cell, the conductive region 38' functions as a drive line connection for the non-volatile memory cell as well as a capacitor electrode. Drive lines are used to program non-volatile memory cells to either a logic one value or logic zero value depending largely upon a predetermined voltage polarity which is applied to the drive line.

The memory cell 10 has several advantages. One advantage of the capacitor used in the memory cell 10 is that only two photolithography steps are needed to form the capacitor. One photolithography step is partially self-aligning and is non-critical in alignment. The annular high-permittivity dielectric region 33 is formed horizontally wider and vertically thicker than most conventional DRAM capacitor dielectrics. The increased width is desirable for high-permittivity dielectric materials. In spite of the increased width of the annular high-permittivity dielectric region 33, memory cell 10 is able to maintain a small substrate surface area on the order of what is achieved by conventional DRAM cells. Buffer layer 34 improves device quality by protecting portions of memory cell 10 from the potentially damaging annular high-permittivity dielectric region 33 processing. Only a single electrode conductive layer deposition is required for electrode formation. The memory cell 10 is also more planar than most conventional memory cells.

In addition, the first and second capacitor electrodes (conductive regions 38' and 38") are formed after the annular high-permittivity dielectric region 33 is formed. The formation of the annular high-permittivity dielectric region 33 may require high temperatures and harsh ambient conditions. By forming the capacitor electrodes (conductive regions 38' and 38") after the formation of the annular high-permittivity dielectric region 33, electrode damage and chemical alteration of the first and second capacitor electrodes are avoided. Also, more materials can be used to form the capacitor electrodes of memory cell 10 due to the fact that the electrodes are not exposed to the annular high-permittivity dielectric region 33 processing.

Figure 6:
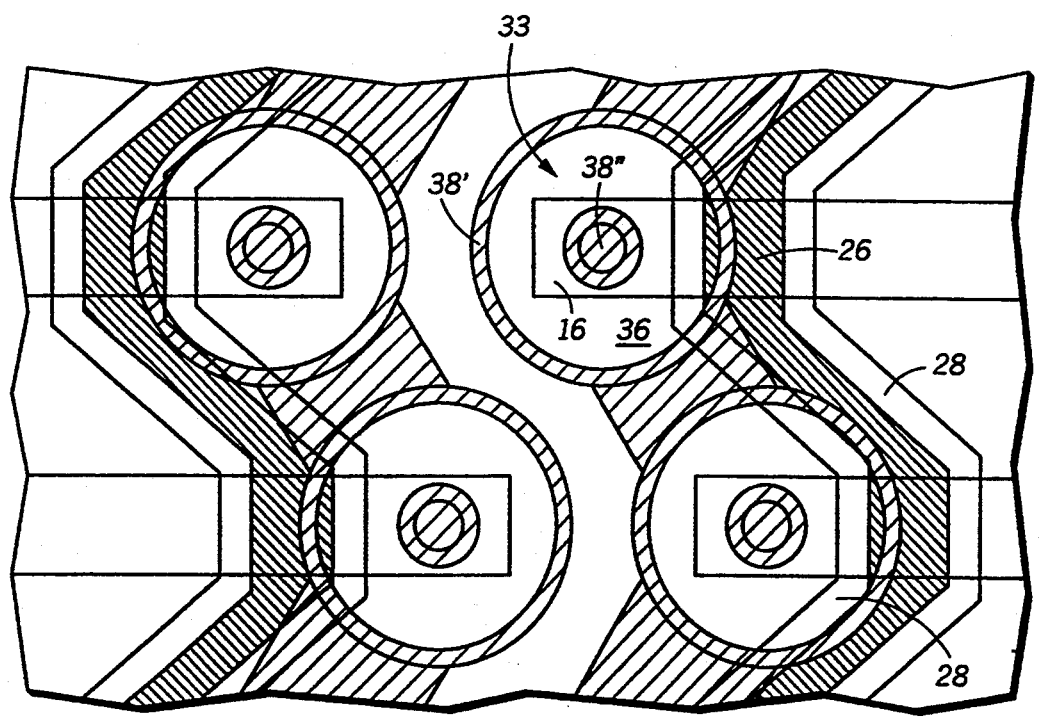
FIG. 6 illustrates, in top perspective view, a plurality of memory cells in accordance with the present invention.

In FIG. 6, a top down perspective view of a plurality of memory cells in accordance with FIG. 5 is illustrated. The first and second electrodes (conductive regions 38' and 38") of FIG. 5 are respectively illustrated by conductive regions 38' and 38" in FIG. 6. Positioned between the electrodes, which are formed by conductive regions 38' and 38", is the annular high-permittivity dielectric region 33 (not labeled in FIG. 6). The conductive region 38" contacts to the current electrode 16 for each memory cell of FIG. 6. The plug region 32 underlies the conductive region 38" and is therefore not labeled in FIG. 6. The FET gate electrodes are each illustrated as gate electrode 26. Gate electrode sidewall spacers are each illustrated as spacer 28 in FIG. 6. A plurality of capacitor electrodes formed by conductive region 38' is connected together via layer 38, or equivalently conductive region 38', of FIG. 4. These electrodes are connected to ground for a DRAM cell or function as a drive line for a non-volatile memory cell FIG. 6 illustrates the small surface area achieved by memory cell 10. FIG. 6 also illustrates how a plurality of memory cells in accordance with memory cell 10 can be interconnected to form an integrated circuit memory device having millions of memory cells.

The capacitor electrode interconnects illustrated in FIG. 6 are formed by the same conductive layer 38 that formed the capacitor electrodes (conductive regions 38' and 38''). The process for forming memory cell 10 is therefore simplified by the fact that one conductive layer is used to form both electrical interconnects and the capacitor electrodes.

Figure 7:
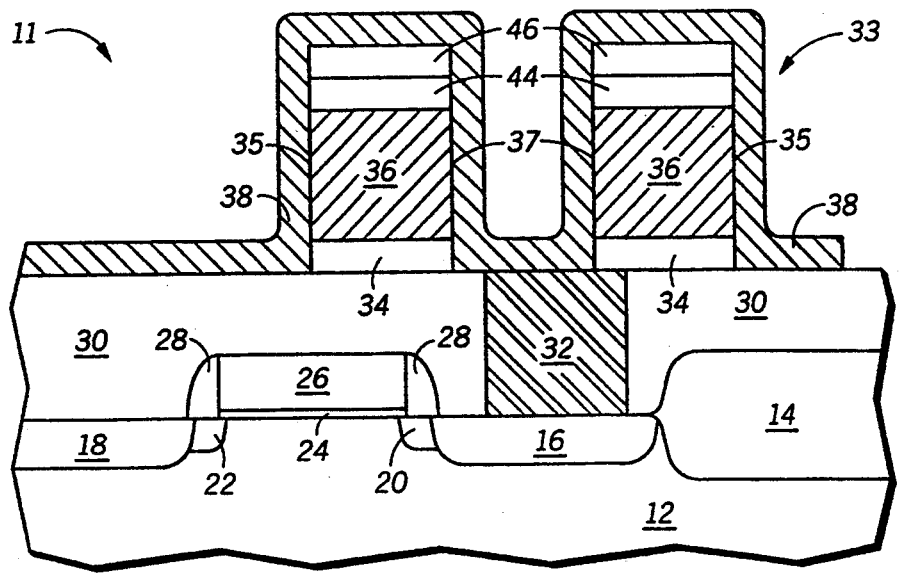
FIGS. 7-8 illustrate, in cross-sectional form, the formation of an alternative capacitor structure in accordance with the present invention.
Figure 8:
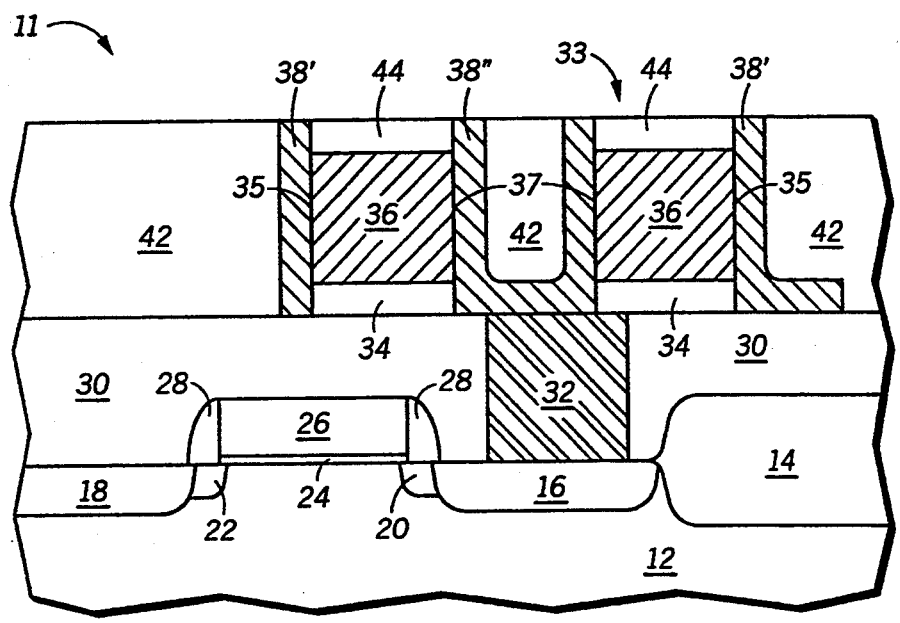

In FIGS. 7-8, the formation of an alternative capacitor structure 11 is illustrated. Elements in FIGS. 7-8 which are analogous to elements in FIGS. 1-5 are identically labeled. The capacitor structure 11 may be used in a process flow similar to the process flow discussed in FIGS. 1-5 to form a memory cell in accordance with the present invention. In FIG. 7, an etch stop layer 46 and a polish stop layer 44 are formed overlying the annular high-permittivity dielectric region 33. After buffer layer 34 is formed, the high-permittivity dielectric layer 36 is formed overlying buffer layer 34. The polish stop layer 44 is formed overlying the high-permittivity dielectric layer 36, and the etch stop layer 46 is formed overlying the polish stop layer 44.

The stack formed by the layers 34, 36, 44, and 46 is etched to form the annular high-permittivity dielectric region 33. This etch step also forms self-aligned portions of both the etch stop layer 46 and the polish stop layer 44 over a top potion of the annular high-permittivity dielectric region 33 as illustrated. Conductive layer 38 is formed overlying the annular high-permittivity dielectric region 33 and the dielectric layer 30 in a manner similar to the formation of conductive layer 38 illustrated in FIG. 3.

The etch stop layer 46 functions as an etch stop to protect the underlying annular high-permittivity dielectric region 33 from the etch steps used to remove portions of the conductive layer 38 to form the first and second capacitor electrodes. The etch stop layer 46 is in most cases a dielectric material that etches slowly or does not etch at all when exposed to the chemicals used to etch the conductive layer 38. The etch stop layer 46 is, for example, a layer of one of either silicon nitride, titanium dioxide, or silicon dioxide.

The polish stop layer 44 is any material that protects the annular high-permittivity dielectric region 33 from damage due to a planarizing or polishing etch-back procedure which is described above in reference to FIG. 5. The polish stop layer 44 is, for example, a layer of aluminum oxide. In general, the layers 44 and 46 protect or passivate the annular high-permittivity dielectric region 33 from subsequent processing.

It should be apparent that both the etch stop layer 46 and the polish stop layer 44 may be formed as one single layer. The one single layer may be able to function as an etch stop layer and a polish stop layer. It should also be apparent that the etch stop layer 46 and the polish stop layer 44 may be used independently of each other (i.e. both are not required, and one can be formed and used while the other is not formed or used).

In FIG. 8, a completed view of the alternative capacitor structure 11 is illustrated. In some cases, the polish stop layer 44 will remain over the annular high-permittivity dielectric region 33. In other cases, this region may be removed by conventional etching.

FIGS. 1-5 have been illustrated using a planar transistor (FET). Several vertical transistors exist in the prior art and are well documented. It should be readily understood that a vertical transistor may also be formed instead of the planar transistor of FIGS. 1-5.

Figure 9:
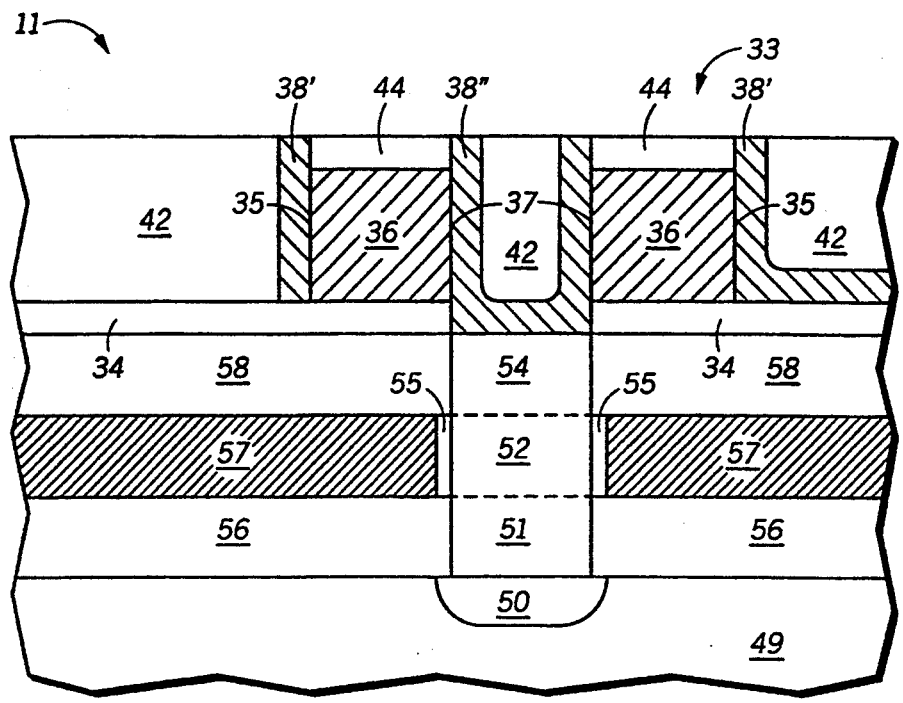
FIG. 9 illustrates, in cross-sectional form, a memory cell formed with a vertical transistor, the memory cell being in accordance with the present invention.

In FIG. 9, a vertical transistor is formed having a first electrode, formed by conductive region 51 and diffusion 50, a channel region 52, a second electrode 54, a dielectric layer 56, a gate conductive layer 57, a gate dielectric 55, and a dielectric layer 58. The vertical transistor is formed overlying a substrate 49. The capacitor illustrated in FIG. 8 and formed in FIGS. 7-8 is formed overlying the vertical transistor. In addition, it should be apparent that the capacitor illustrated in FIG. 5 could be used for the capacitor of FIG. 9. Therefore, elements of FIGS. 1-5 that are similar to elements in FIG. 9 are identically labeled. The conductive region 38'' makes electrical contact to the second electrode 54, and a non-volatile memory cell or a DRAM cell having a high-permittivity capacitor dielectric is formed.

Figure 10:
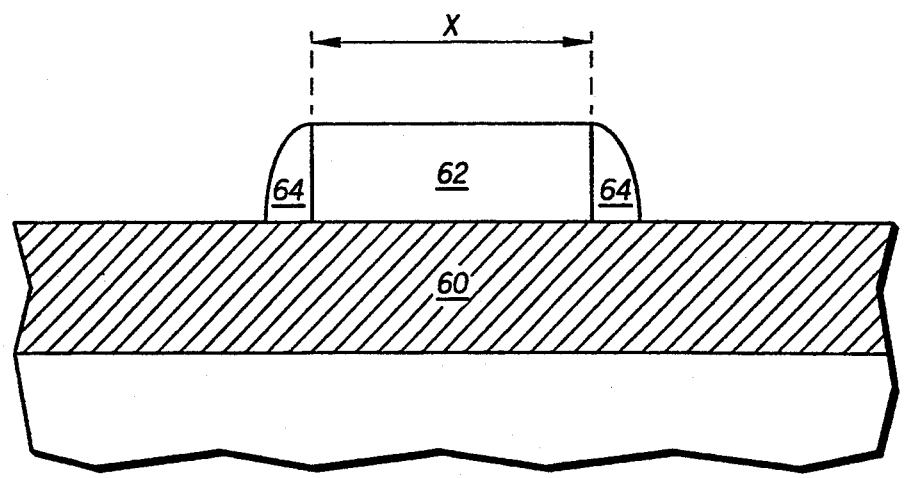
FIGS. 10-12 illustrate, in cross-sectional form, a method for forming an annular high-permittivity dielectric region in accordance with the present invention.
Figure 11:
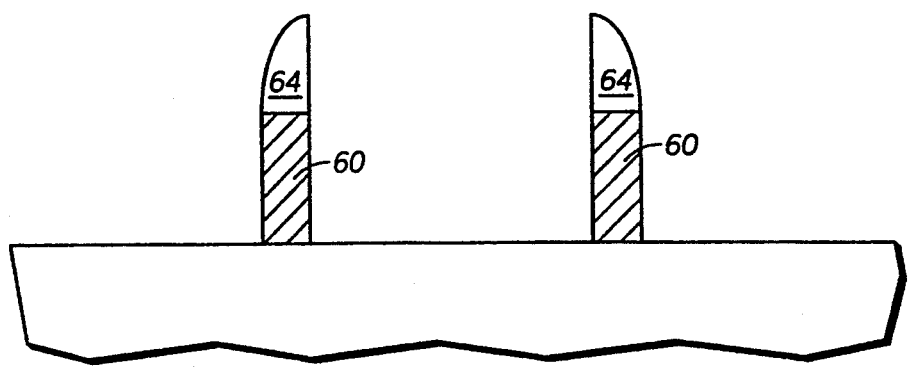
Figure 12:
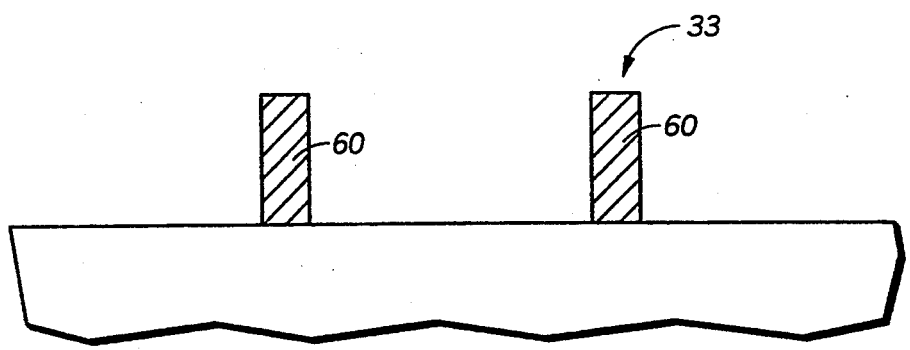

FIGS. 10-12 illustrate an alternative method which is used to form the annular high-permittivity dielectric region 33 discussed herein. A ferroelectric or high-permittivity material 60 is formed overlying a transistor (not illustrated), a dielectric layer (not illustrated), or a substrate (not illustrated). A layer 62 is formed overlying the high-permittivity material 60. The layer 62 is formed having a width "X" which is equal to or greater than a lithographic minimum feature size (e.g. 0.5 microns is a typical width "X"). The layer 62 is any material that can be etched selective to high-permittivity material 60 and adhere to material 60. In a preferred form, layer 62 is an oxide layer such as a TEOS layer. A spacer 64 is formed adjacent a sidewall of the layer 62. The spacer 64 is any material that can be etched selectively to high-permittivity material 60 and adhere to material 60. For example, spacer 64 may be nitride or polysilicon.

In FIG. 11, layer 62 is selectively and completely removed leaving the spacer 64 flee-standing over the high-permittivity material 60. The spacer 64 is then used as a hard mask to etch the high-permittivity material 60 as illustrated.

In FIG. 12, the spacer 64 is removed and an annular high-permittivity dielectric region 33 remains that has a width that is less than conventional photolithographic capability. The horizontal width of the annular high-permittivity dielectric region 33 ranges from roughly 500 Angstroms to 2000 Angstroms using this technique. The annular high-permittivity dielectric region 33 formed in FIGS. 10-12 may be used in any of the embodiments presented herein that use an annular high-permittivity dielectric region 33.

If the annular high-permittivity dielectric region 33 width is small, on the order of 500 Angstroms or less, the permittivity of the annular high-permittivity dielectric region 33 can be small (roughly 10 to 25) and still be capable of achieving a capacitance that is adequate for a DRAM cell. Therefore, for the method illustrated in FIGS. 10-12, lower dielectric materials, including some conventional and widely accepted oxides, may be used with the inventive devices presented herein.

While the present invention has been illustrated and described with reference to specific embodiments, further modifications and improvements will occur to those skilled in the art. For example, the annular high-permittivity dielectric region 33 may be formed into any geometry such as a rectangle, a cylinder, a triangle, a polygon, or another geometry. Several vertical transistors exist, such as the surrounding gate transistor (SGT), that can be used with the inventive capacitor to form a memory cell. Many different materials exist that can be used for formation of the annular high-permittivity dielectric region 33 or the first and second capacitor electrodes. Many methods exist for forming conductive plug regions. All of these methods can be used to form the plug regions described herein. Many forms of planar transistor improvement technologies exist, such as LDD formations, raised source and drain electrodes, channel implantation, improved isolation, removable spacers, advanced materials, silicon on insulator (SOI) devices, and electrode contact techniques. All of these improvements are compatible with the inventive capacitor and memory cell presented herein. It is important to note that tantalum pentoxide may be used as an interelectrode capacitor dielectric for the inventive capacitor presented herein even though tantalum pentoxide is not usually regarded as a high-permittivity dielectric. It is to be understood, therefore, that this invention is not limited to the particular forms illustrated and that it is intended in the appended claims to cover all modifications that do not depart from the spirit and scope of this invention.

I claim:

1. A method for forming a capacitor comprising the steps of:
   providing a substrate;
   forming an annular high-permittivity dielectric region overlying the substrate, the annular high-permittivity dielectric region having an inner sidewall and an outer sidewall and functioning as a capacitor dielectric;
   forming a first capacitor electrode adjacent the inner sidewall of the annular high-permittivity dielectric region after the step of forming the annular high-permittivity dielectric region; and
   forming a second capacitor electrode adjacent the outer sidewall of the annular high-permittivity dielectric region after the step of forming the annular high-permittivity dielectric region.

2. The method of claim 1 further comprising the steps of:
   forming a transistor having a first current electrode and a second current electrode, the first and second current electrodes being separated by a channel region;
   forming a gate dielectric overlying the channel region;
   forming a gate overlying the gate dielectric, overlying the channel region, and positioned between the first and second current electrodes of the transistor; and
   electrically coupling one of either the first current electrode or the second current electrode of the transistor to the first capacitor electrode.

3. The method of claim 1 further comprising the steps of:
   forming a transistor having a first current electrode and a second current electrode separated by a channel region and a gate adjacent the channel region wherein the gate is physically separated from the channel region by a gate dielectric;
   electrically coupling one of either the first current electrode or the second current electrode to the first capacitor electrode; and
   electrically coupling the first and second current electrodes of the transistor and the first and second capacitor electrodes for operation as one of either a dynamic random access memory cell or a nonvolatile memory cell.

4. The method of claim 1 wherein the steps of forming the first and the second capacitor electrodes comprise the steps of:
   forming a conductive layer of material overlying the annular high-permittivity dielectric region; and
   selectively removing portions of the conductive layer to form both the first and second capacitor electrodes.

5. The method of claim 4 wherein the step of selectively removing portions of the conductive layer comprises the step of:
   using a planarization step to remove portions of the conductive layer of material from a top portion of the annular high-permittivity dielectric region.

6. The method of claim 1, further comprising the steps of:
   forming a plurality of capacitors overlying the substrate, each capacitor being in accordance with claim 1 and having first and second capacitor electrodes formed from a single conductive layer of material; and
   electrically connecting the second capacitor electrode of each capacitor of the plurality by using the single conductive layer of material.

7. The method of claim 1, further comprising the step of:
   forming a buffer layer of material underlying the annular high-permittivity dielectric region.

8. The method of claim 1, further comprising the step of:
   forming an etch stop layer of material overlying the annular high-permittivity dielectric region.

9. The method of claim 1, further comprising the step of:
   forming a polish stop layer of material overlying the annular high-permittivity dielectric region.

10. The method of claim 1, further comprising the steps of:
    forming one of either the first or the second capacitor electrodes from a material comprising a material selected from a group consisting of: platinum, aluminum, titanium nitride, titanium, tantalum, ruthenium oxide, copper, molybdenum, ruthenium, gold, tantalum nitride, indium-tin oxide, and tungsten; and
    forming the annular high-permittivity dielectric region from a material comprising a material selected from a group consisting of: lead zirconium titanate, barium titanate, lithium niobate, lead lanthanum zirconium titanate, titanium silicate, calcium titanate, bismuth titanate, strontium titanate, lead zirconate, titanium oxide, zirconium oxide, and lead titanate.

11. The method of claim 1 wherein the step of forming the annular high-permittivity dielectric region comprises:
    forming the annular high-permittivity dielectric region as a ferroelectric material.

12. The method of claim 1, further comprising the steps of:

forming a transistor having a first current electrode and a second current electrode separated by a channel region and having a gate adjacent the channel region wherein the gate is isolated from the channel region by a gate dielectric;

forming a dielectric isolation region overlying the transistor, the dielectric isolation region having an opening that exposes a portion of one of either the first current electrode or the second current electrode to form an exposed electrode portion; and forming a conductive plug region within the opening which electrically connects the exposed electrode portion to the first capacitor electrode of said capacitor.

13. A method for forming a memory cell comprising the steps of:

forming a transistor having a first current electrode and a second current electrode separated by a channel region and a gate adjacent the channel region wherein the gate is physically separated from the channel region by a gate dielectric;

forming a dielectric isolation region overlying the transistor, the dielectric isolation region having an opening that exposes a portion of one of either the first current electrode or the second current electrode to form an exposed electrode portion;

forming an annular high-permittivity dielectric region having an inner and an outer sidewall, the annular high-permittivity dielectric region overlying the dielectric isolation region and functioning as a capacitor dielectric;

forming a first capacitor electrode adjacent the inner sidewall of the annular high-permittivity dielectric region after the step of forming the annular high-permittivity dielectric region, the first capacitor electrode being electrically coupled to the first current electrode; and forming a second capacitor electrode adjacent the outer sidewall of the annular high-permittivity dielectric region after the step of forming the annular high-permittivity dielectric region.

14. The method of claim 13 wherein the steps of forming the first and the second capacitor electrodes comprise:

forming the first and second capacitor electrodes by selectively removing portions of a single conductive layer of material.

15. The method of claim 13 further comprising:

electrically connecting the memory cell to form one of either a dynamic random access memory or a non-volatile memory.

16. The method of claim 13, further comprising the step of:

forming a buffer layer of material underlying the annular high-permittivity dielectric region.

17. The method of claim 13, further comprising the step of:

forming an etch stop layer of material overlying the annular high-permittivity dielectric region.

18. The method of claim 13, further comprising the step of:

forming a polish stop layer of material overlying the annular high-permittivity dielectric region.

19. The method of claim 13 wherein the step of forming the annular high-permittivity dielectric region comprises:

forming the annular high-permittivity dielectric region as a ferroelectric material.

20. A method for forming a capacitor comprising the sequential steps of:

providing a substrate;

forming an annular capacitor dielectric layer overlying the substrate, the annular capacitor dielectric layer having an inner surface and an outer surface, the inner surface and outer surface both being substantially perpendicular to the surface of the substrate; and simultaneously forming a first capacitor electrode laterally adjacent the inner surface and a second capacitor electrode, which is separated from the first capacitor electrode, laterally adjacent the outer surface.

21. The method of claim 20 wherein the step of forming an annular capacitor dielectric layer comprises:

forming the annular capacitor dielectric layer as a ferroelectric material.

22. A method for forming a capacitor comprising the steps of:

providing a substrate;

forming an annular capacitor dielectric layer overlying the substrate, the annular capacitor dielectric layer having an inner surface and an outer surface, the annular capacitor dielectric layer being made of a high-permittivity material;

forming a first electrode adjacent the inner surface after the step of forming the annular capacitor dielectric layer; and forming a second electrode adjacent the outer surface after the step of forming the annular capacitor dielectric layer.

* * * * *